(12) United States Patent
Liu et al.

(10) Patent No.: US 6,764,779 B1
(45) Date of Patent: Jul. 20, 2004

(54) THERMAL BARRIER COATING HAVING LOW THERMAL CONDUCTIVITY

(75) Inventors: Yourong Liu, Elmwood Park, NJ (US); Paul Lawton, Rock Hill, NY (US)

(73) Assignee: Chromalloy Gas Turbine Corporation, Orangeburg, NY (US)

( * ) Notice: Subject to any disclaimer, the term of this patent is extended or adjusted under 35 U.S.C. 154(b) by 139 days.

(21) Appl. No.: 10/372,358

(22) Filed: Feb. 24, 2003

(51) Int. Cl.$^7$ .............................. B32B 15/04; F03B 3/12
(52) U.S. Cl. ...................... 428/702; 428/469; 428/632; 428/633; 428/679; 428/680; 428/697; 428/699; 428/701; 428/336; 416/241 B
(58) Field of Search ................................ 428/469, 632, 428/633, 650, 679, 680, 697, 699, 701, 702, 336; 416/241 B

(56) References Cited

U.S. PATENT DOCUMENTS

| | | | |
|---|---|---|---|
| 5,284,698 A | * | 2/1994 | Marshall et al. |
| 5,350,599 A | * | 9/1994 | Rigney et al. |
| 5,652,044 A | | 7/1997 | Rickerby |
| 5,687,679 A | | 11/1997 | Mullin et al. |
| 5,780,171 A | | 7/1998 | Nissley et al. |
| 5,792,521 A | | 8/1998 | Wortman |
| 5,846,605 A | | 12/1998 | Rickerby et al. |
| 5,942,334 A | * | 8/1999 | Wortman |
| 5,948,516 A | * | 9/1999 | Kriven et al. |
| 6,054,184 A | | 4/2000 | Bruce et al. |
| 6,071,628 A | | 6/2000 | Seals et al. |
| 6,106,959 A | | 8/2000 | Vance et al. |
| 6,183,884 B1 | | 2/2001 | Rickerby |
| 6,284,323 B1 | | 9/2001 | Maloney |
| 6,299,971 B1 | | 10/2001 | Maloney |
| 6,365,236 B1 | | 4/2002 | Maloney |

FOREIGN PATENT DOCUMENTS

| | | |
|---|---|---|
| EP | 0816526 | 10/2001 |
| WO | 0163008 | 8/2001 |

OTHER PUBLICATIONS

H. Wang, R.B. Dinwiddie and P.S. Gaal, "Multiple Station Thermal Diffusivity Instrument", Thermal Conductivity 23, Proceedings of the Twenty–Third Int'l Thermal Conductivity Conference, P119–126, 1996.

S. Raghavan, H. Wang, Thermal Properties of Zirconia Co–Doped With Trivalent and Pentavalent Oxides, Acta mater. 49(2001) 169–179.

* cited by examiner

*Primary Examiner*—Deborah Jones
*Assistant Examiner*—Jennifer McNeil
(74) *Attorney, Agent, or Firm*—Mitchell D. Bittman

(57) ABSTRACT

This invention provides a metallic article with a metallic substrate having a thermal barrier ceramic coating on its surface, the ceramic coating comprising a plurality of first layers of about 6 to 8 wt % yttria stabilized zirconia alternating with a plurality of second layers of about 18 to 22 wt % yttria stabilized zirconia. The alternating layers can be distinct layers or gradient layers.

17 Claims, 5 Drawing Sheets

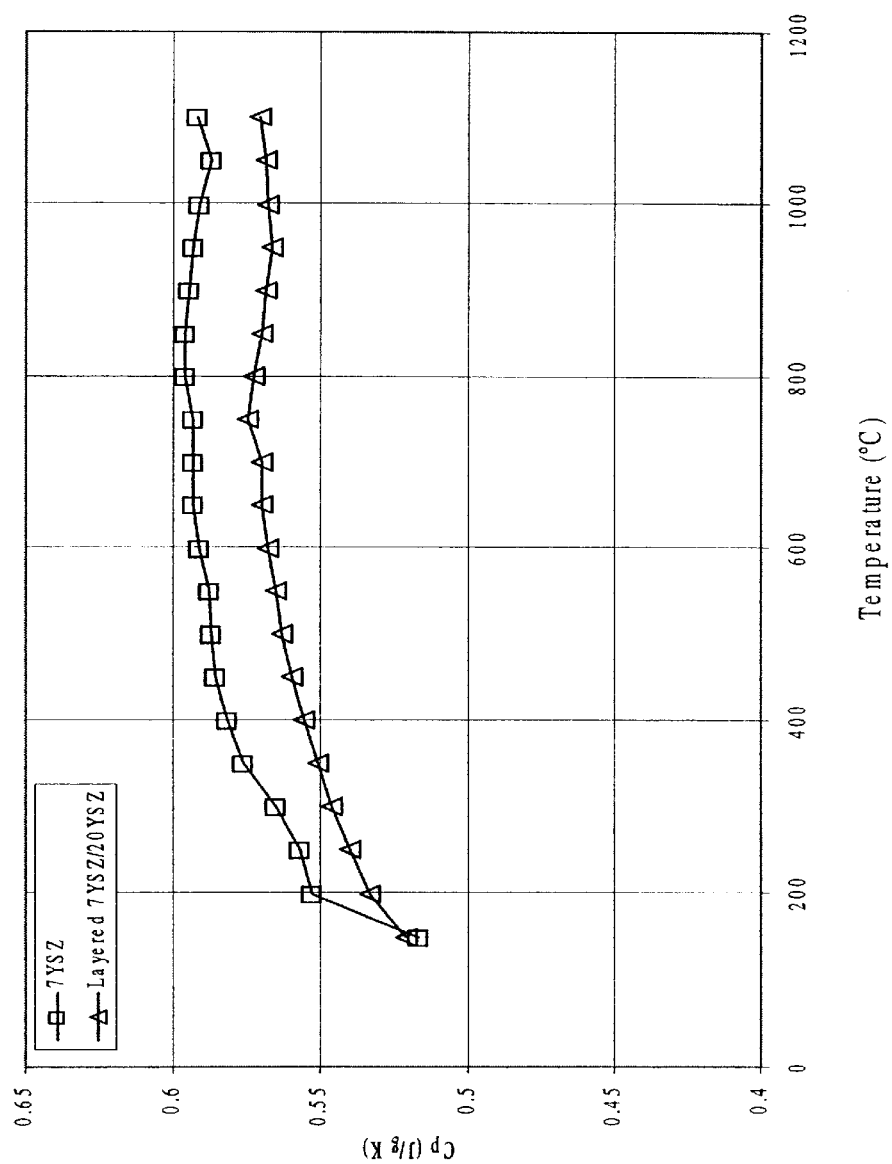
Fig.2 Specific heat vs. temperature

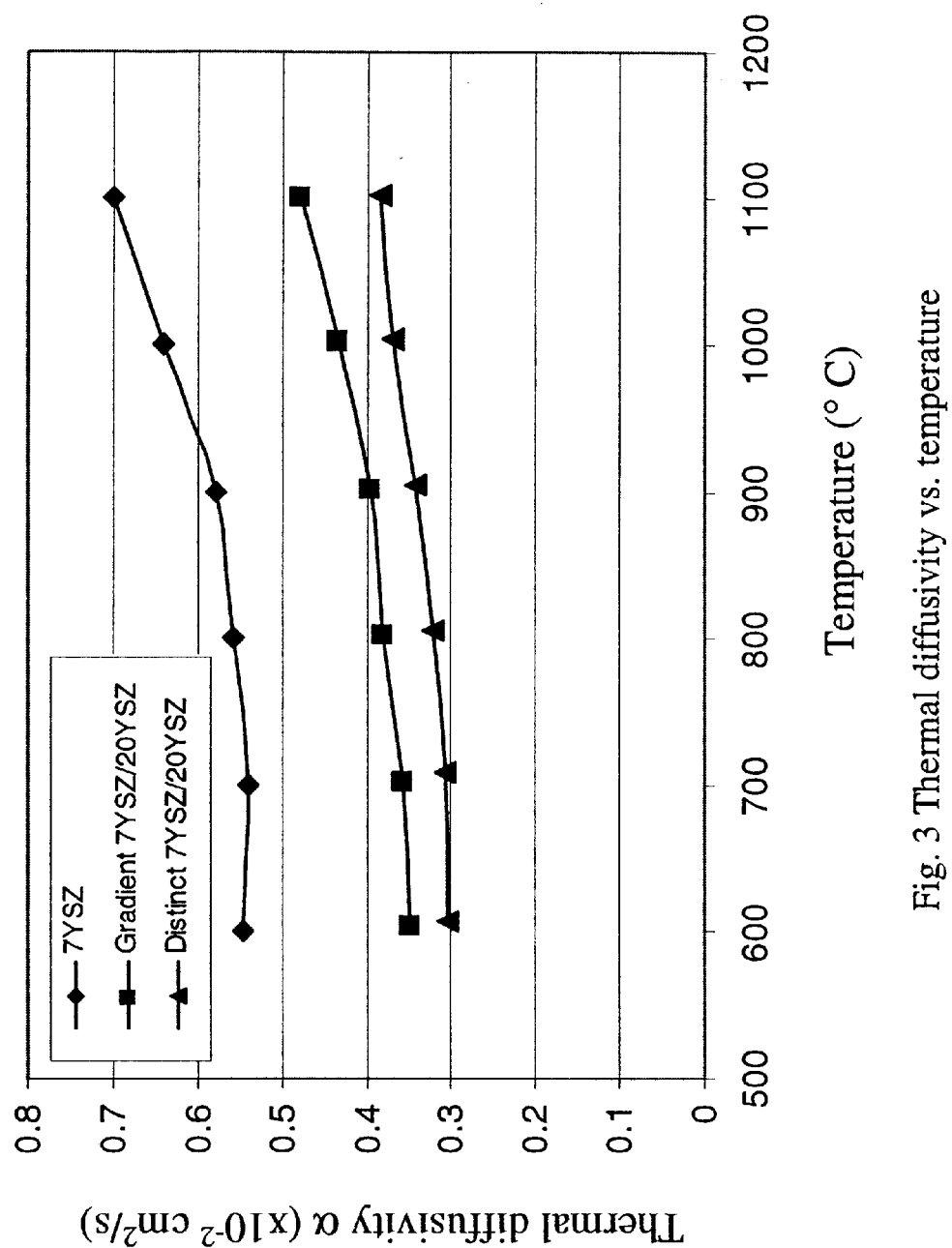
Fig. 3 Thermal diffusivity vs. temperature

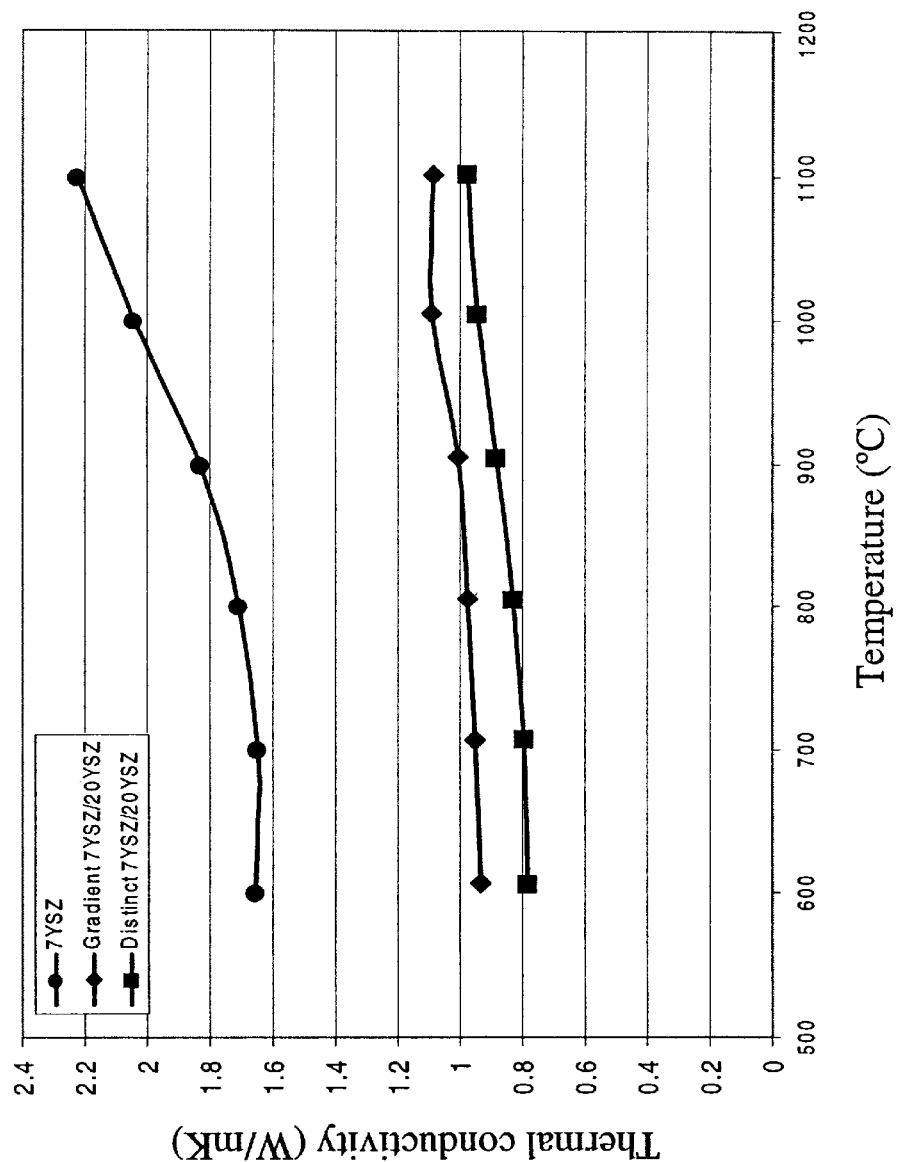
Fig.4 Thermal conductivity of coatings as deposited vs. temperature

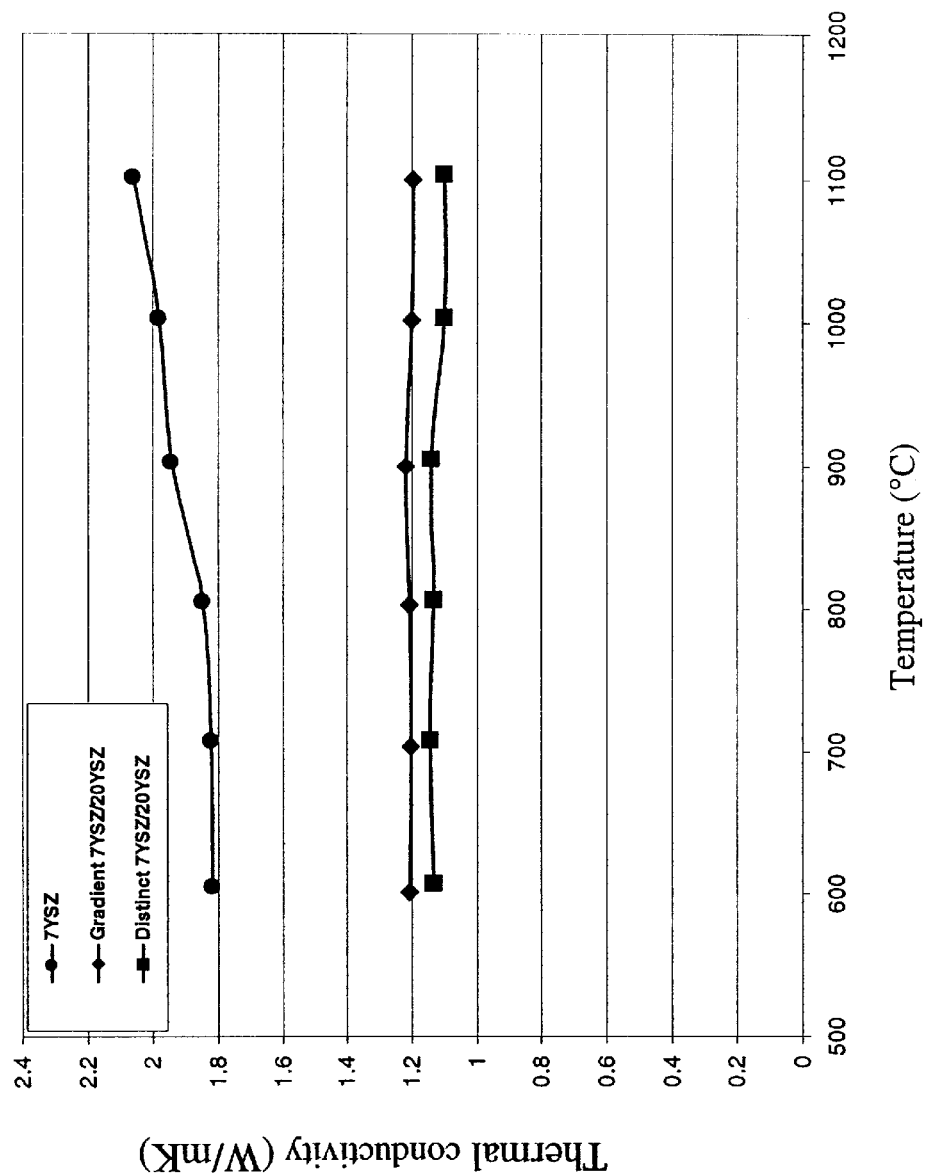
Fig 5. Thermal conductivity of coatings as aged vs. temperature

THERMAL BARRIER COATING HAVING LOW THERMAL CONDUCTIVITY

FIELD OF THE INVENTION

The present invention relates generally to the field of thermal barrier coatings that are used in elevated temperature applications such as gas turbine engines. In particular, this invention relates to a thermal insulating ceramic coating which has a low thermal conductivity and to the metallic articles such as turbine components, (e.g. blades and vanes) that the coatings are applied to prevent the components from overheating during high temperature operation.

BACKGROUND OF THE INVENTION

Advanced gas turbine engines are continuously pursuing higher thrust and efficiency by the use of increased operating temperatures. However, the demand of increasing temperature is limited by the ability of most advanced nickel and cobalt based superalloy turbine blades and vanes to maintain their mechanical strength when exposed to the heat, oxidation, erosion and corrosion environment. Thus it is desirable to increase turbine engine operating temperatures, while decreasing the heat transfer to the metallic parts. One approach is to apply a thermal barrier coating onto the turbine blades and vanes to insulate the components from the high temperature operating environment. The ability of the thermal barrier coating to decrease the temperature to the metallic substrate depends upon the thermal conductivity of the thermal barrier coating. It is therefore desirable to develop thermal barrier coatings having low thermal conductivity to insulate effectively the thermal transfer to the components used in gas turbine engines.

Efforts have been made to lower the thermal conductivity of thermal barrier coatings by modifying the chemistry and microstructure of current 7YSZ thermal barrier coating systems as disclosed in EP0816526A2, U.S. Pat. No. 6,071,628, U.S. Pat. No. 5,846,605, U.S. Pat. No. 6,183,884B1, U.S. Pat. No. 5,792,521, U.S. Pat. No. 5,687,679, W01/63008 and U.S. Pat. No. 6,284,323B1. These approaches decreased thermal conductivity of thermal barrier coatings to various extents with the minimum reported to be about half the thermal conductivity of typical 7 wt % yttria stabilized zirconia (7YSZ).

It is a main object of this invention to decrease thermal conductivity of thermal barrier coatings providing a new ceramic material with low thermal conductivity and a method of applying such a material onto the metallic articles to form a thermal barrier coating system with increase thermal insulation capability.

SUMMARY OF THE INVENTION

Briefly, the invention provides a metallic article with a metallic substrate having a thermal barrier ceramic coating on its surface, the ceramic coating comprising a plurality of first layers of about 6 to 8 wt % yttria stabilized zirconia alternating with a plurality of second layers of about 18 to 22 wt % yttria stabilized zirconia. The alternating layers can be distinct layers or gradient layers.

BRIEF DESCRIPTION OF THE DRAWINGS

FIG. 2 shows the specific heat of coatings vs. temperature.

FIG. 3 shows the thermal diffusivity of coatings vs. temperature.

FIG. 4 shows the thermal conductivity of coatings as deposited vs. temperature.

FIG. 5 shows the thermal conductivity of coatings as aged vs. temperature.

DETAILED DESCRIPTION OF THE INVENTION

Figure 1:
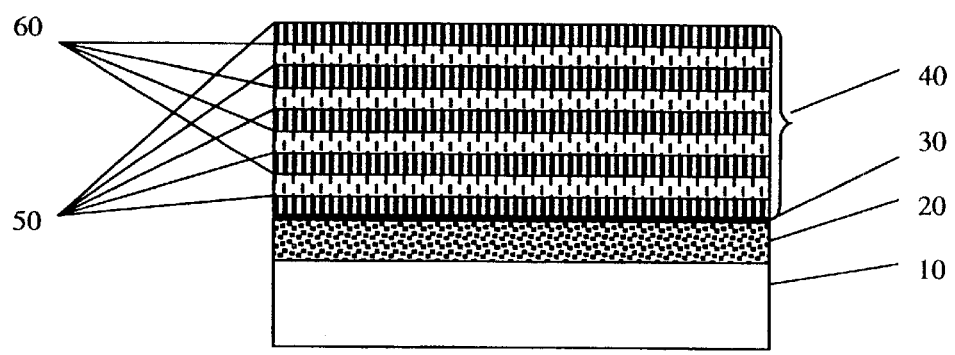
FIG. 1 shows the ceramic coating having alternating layers of 6–8 wt. % YSZ and 18–20 wt. % of YSZ.

This invention provides a thermal barrier ceramic coating having a low thermal conductivity comprising a plurality of first layers of about 6 to 8 wt. % yttria stabilized zirconia alternating with a plurality of second layers of about 18 to 22 wt. % yttria stabilized zirconia. The alternating first and second layers can be distinct layers or gradient layers. By distinct layers what is meant is an interface which separates the layers (i.e. a clear line distinguishing the crystal growth of the different layers which is observable under a microscope). By gradient layers what is meant is no sharp interface between the layers (i.e. no interruption in crystal growth from one layer to another as observed under a microscope). The first layers of about 6 to 8 wt. % yttria stabilized zirconia (YSZ) have a tetragonal structure, while the second layers of about 18 to 20 wt. % yttria stabilized zirconia (YSZ) have a cubic structure. The ceramic coating of this invention is applied to a metallic article providing a thermal barrier coating with low thermal conductivity.

As shown in FIG. 1, the ceramic coating 40 has alternating layers of first yttria stabilized zirconia layers 50 and second yttria stabilized zirconia layers 60. The ceramic coating is deposited onto a bond coat 20 that was applied onto a superalloy substrate 10 prior to the ceramic coating deposition. Preferably, the ceramic coating starts (at the bottom of the ceramic coating adjacent to the metallic substrate) and ends (on the top surface) with the about 6 to 8 wt.% YSZ for good bonding between the ceramic and metallic bond coat and for good erosion resistance on the top surface.

Generally, the ceramic coating has about 3 to 50 first layers and about 2 to 50 second layers, preferably about 5 to 25 first layers and about 5 to 25 second layers, with each layers being from about 1 $\mu$m to 50 $\mu$m thick, preferably from about 5 to 25 $\mu$m thick. The ceramic coating generally has a total thickness of about 10 $\mu$m to 500 $\mu$m.

The ceramic coating of this invention has a low thermal conductivity generally within the range of about 0.6 to 1.2 W/mK from 600° C. to 1100° C. The thermal conductivity of the ceramic coating having 7YSZ and 20YSZ alternating distinct layers as deposited was measured as 0.78 to 0.97 W/mK from 600° C. to 1100° C. This thermal conductivity is 44 to 48% of the measured thermal conductivity of a typical 7YSZ coating (1.65–2.22 W/mK from 600° C. to 1100° C.). The thermal conductivity of the ceramic coating having alternating gradient layers of 7YSZ and 20YSZ as deposited was measured as 0.93 to 1.08 W/mK (from 600° C. to 1100° C.), which is about 48% to 58% of the thermal conductivity of typical 7YSZ. The ceramic coating having 7YSZ and 20YSZ alternating distinct layers as aged (after subjecting the coating to a heat treat of 1200° C. for 50 hours) was measured to have a thermal conductivity of 1.10 to 1.14 W/mK (from 600° C. to 1100° C.), which is about 53 to 62% of the measured thermal conductivity of a typical 7YSZ coating as aged. The ceramic coating having 7YSZ and 20YSZ alternating gradient layers as aged was measured to have a thermal conductivity of 1.2 to 1.22 W/mK (from 600° C. to 1100° C.), which is about 58 to 66% of the thermal conductivity of typical 7YSZ as aged.

Techniques for applying the ceramic coatings include air plasma thermal spray (APS), low pressure plasma spray (LPPS), high velocity oxygen fuel (HVOF), sputtering and electron beam physical vapor deposition (EBPVD), etc. In a preferred embodiment the ceramic coating is applied by electron beam physical vapor deposition (EBPVD) due to the columnar microstructure with inter-column gaps produced. The ceramic coating is deposited as a layered microstructure to reduce thermal conductivity.

The process of applying the ceramic coating by EBPVD is similar to that of applying 7YSZ in production. The evaporating source in one crucible is a 7YSZ solid ingot, and in a second crucible is a 20YSZ ingot. The layered microstructure of the ceramic coating was applied by alternating the evaporation of the solid ingots from the two crucibles under a controlled electron beam power adjustment gun program for electron beam physical vapor deposition.

For increased adhesion a metallic bond coat is applied onto the metallic article, such as a nickel or cobalt based superalloys prior to the ceramic coating deposition. The metallic bond coat can be an MCrAlY alloy, wherein M is Ni, Co or mixtures thereof. Such alloys have a broad composition of 10 to 35% chromium, 5 to 15% aluminum, 0.01 to 1% yttrium, or hafnium, or lanthanum, with M being the balance. Minor amounts of other elements such as Ta or Si may also be present. The MCrAlY bond coat can be applied by EBPVD, though sputtering, low pressure plasma or high velocity oxy fuel spraying or entrapment plating may also be used.

Alternatively, the metallic bond coat can be comprised of an intermetallic aluminide such as nickel aluminide or platinum aluminide. The aluminide bond coating can be applied by standard commercially available aluminide processes whereby aluminum is reacted at the substrate surface to form an aluminum intermetallic compound which provides a reservoir for the growth of an alumina scale oxidation resistant layer. Thus the aluminide coating is predominately composed of aluminum intermetallic [e.g., NiAl, CoAl and (Ni, Co) Al phase] formed by reacting aluminum vapor species, aluminum rich alloy powder or surface layer with the substrate elements in the outer layer of the superalloy component. This layer is typically well bonded to the substrate. Aluminizing may be accomplished by one of several conventional prior art techniques, such as, the pack cementation process, spraying, chemical vapor deposition, electrophoresis, sputtering, and appropriate diffusion heat treatments. Other beneficial elements can also be incorporated into diffusion aluminide coatings by a variety of processes. Beneficial elements include Pt, Pd, Si, Hf, Y and oxide particles, such as alumina, yttria, hafnia, for enhancement of alumina scale adhesion, Cr and Mn for hot corrosion resistance, Rh, Ta and Cb for diffusional stability and/or oxidation resistance and Ni, Co for increasing ductility or incipient melting limits. In the specific case of platinum modified diffusion aluminide coating layers, the coating phases adjacent to the alumina scale will be platinum aluminide and/or nickel-platinum aluminide phases (on a Ni-base superalloy).

Through oxidation an alumina (i.e., aluminum oxide) layer is formed over the metallic bond coat. This alumina layer provides both oxidation resistance and a bonding surface for a ceramic coating. The alumina layer may be formed before the ceramic coating is applied, during application of the coating or subsequently by heating the coated article in an oxygen containing atmosphere at a temperature consistent with the temperature capability of the superalloy, or by exposure to the turbine environment. The sub-micron thick alumina scale will thicken on the aluminide surface by heating the material to normal turbine exposure conditions.

The thickness of the alumina scale is preferably sub-micron (up to about one micron). The alumina layer may also be deposited by chemical vapor deposition or by EBPVD following deposition of the metallic bond coat.

Alternatively, the metallic bond coat may be eliminated if the substrate is capable of forming a highly adherent alumina scale or layer. Examples of such substrates are very low sulfur (<1 ppm) single crystal superalloys, such as PWA 1487 and Rene N5, which also contain 0.1% yttrium to enhance adhesion of the thermally grown alumina scale.

FIG. 1 shows the ceramic coating 40 which was applied by EBPVD onto a metallic bond coat 20, such as an MCrAlY and/or platinum modified aluminide. A bond coat 20 was applied to a metallic article 10, of a nickel or cobalt based superalloy prior to the application of the ceramic coating 40. The bond coat 20 provides strong adhesion between the metallic substrate 10 and the ceramic coating 40. The ceramic coating adheres to the bond coat 20 through a thermally grown alumina film 30 on the bond coat 20.

The ceramic coating system of this invention provides many advantages for use in gas turbine engines. The reduction in thermal conductivity of 40 to 60 percent can reduce the thickness required for the thermal barrier coating (TBC) by approximately one half for the same degree of thermal insulation. This will lower the cost of the TBC due to the time saved in applying the coating, ingot material savings and energy savings in production. Decreasing in the coating thickness will also lower the weight of the gas turbine component, e.g. blades and vanes, which can provide a significant reduction in the weight of the disk that holds these components. Depositing the same thickness of the ceramic coating will allow an increased operating temperature to be achieved without overheating the metallic parts allowing the engine to operate a higher thrust and efficiency. The increased insulating capabilities of the ceramic coating could also reduce the requirements for air cooling the part.

This invention is generally applicable to any metallic article which uses thermal barrier coating systems, and includes various modifications according to the principles of this invention.

EXAMPLE

A ceramic coating was applied by alternating the EBPVD evaporation of a 7YSZ ingot and a 20YSZ ingot. The coating displayed a columnar structure oriented perpendicularly to the surface of the substrate. The ceramic coating had deposited 5 layers of 7YSZ about 27 $\mu$m thick alternating with 4 layers of 20YSZ about 27 $\mu$m thick.

It is known that the thermal conductivity of material K (W/mK) is determined by its thermal diffusivity $\alpha$ (cm$^2$/s), density $\rho$ (g/cm$^3$) and specific heat $C_p$ (J/g K), i.e. K=$\alpha \cdot \rho \cdot C_p$. The specific heat of the ceramic coating was tested using Differential Scanning Calorimetry (DSC) on an Omnitherm DSC 1500 in Oak Ridge National Lab. The samples are free standing ceramic coatings, i.e. an intact ceramic coating without substrate or bond coat. The free standing samples of ceramic coating are about 250 $\mu$m thick and are machined to 6 mm in diameter to meet the requirements of the test instrument. The test was run in the temperature range of 100° C. to 1100° C. using sapphire as the baseline standard. The results in FIG. 2 show that the specific heat of the 7YSZ/20YSZ layered ceramic coating is about 4% to 10% lower than that of typical 7YSZ at above 200° C. As specific heat is not sensitive to microstructure, there was no difference in the specific heat of the alternating distinct layers versus the alternating gradient layers of 7YSZ and 20YSZ.

The thermal diffusivity (α) was measured by the laser flash technique at Oak Ridge National Laboratory on a Flashline 5000 Thermal Diffusivity System, see H. Wang, R. B. Dinwiddie and P. S. GAAL, "Multiple Station Thermal Diffusivity Instrument", THERMAL CONDUCTIVITY 23, Proceedings of the Twenty-Third International Thermal Conductivity Conference, P119–126. Two or three free standing samples of each kind were measured at every 100-degree interval from 600° C. to 1100° C. Three measurements of each sample were conducted at every temperature. The time-temperature curves were analyzed by the method of Clark and Taylor, which takes into account radiation losses and uses the heating part of the curve to calculate thermal diffusivity. The average readings of two or three samples with three measurements in each at temperature from 600° C. to 1000° C. are plotted in FIG. 3. It shows the thermal diffusivity of the layered ceramic coating is 40% to 45% lower than that of typical 7YSZ coating. In addition, alternating distinct layers of 7YSZ and 20YSZ has a thermal diffusivity which is about 15% lower than alternating gradient layers of 7YSZ and 20YSZ.

The density of the 7YSZ/20YSZ layered ceramic coating is 4.3 to 4.5 g/cm$^3$, which is 10 to 14% lower than that of the typical 7YSZ coating (5.0 g/cm$^3$). This lower density allows the gas turbine component coated with the ceramic coating to have a lower coating weight and a reduced weight coated turbine component compared to typical 7YSZ coated components.

The thermal conductivity of the layered ceramic coatings is calculated according to their value of thermal diffusivity, density and specific heat, and then is plotted in FIG. 4, which shows the thermal conductivity of ceramic coating with 7YSZ/20YSZ alternate distinct layers and alternate gradient layers at temperatures of 600° C. to 1100° C. The alternating distinct layered ceramic coating as deposited shows a low thermal conductivity of 0.78–0.97 W/mK, which is 44 to 48% of the measured thermal conductivity of typical 7YSZ coating (1.65–2.22 W/mK from 600° C. to 1100° C.). The alternating gradient layered ceramic coating shows a thermal conductivity of 0.93–1.08 W/mK from 600° C. to 1100° C., which is 48 to 58% of the typical 7YSZ coating.

Another significant concern is the thermal conductivity of a thermal barrier coating during operation in a turbine gas engine where the coatings are subject to high temperature for a long period of time. During engine operation sintering is an important factor that will affect thermal conductivity. To investigate the effect of sintering on thermal conductivity of the ceramic coatings, samples of the 7YSZ/20YSZ alternate distinct layers and alternate gradient layers of ceramic coatings applied by EBPVD were aged heat treat at 1200° C. for 50 hours. FIG. 5 shows the thermal conductivity of the layered ceramic coatings and typical 7YSZ coating after aging heat treat. Comparing the thermal conductivity of the coatings as deposited in FIG. 4, all the coatings as aged have higher thermal conductivity than those as deposited. This is because that the gaps between the adjacent columns in EBPVD applied thermal barrier coatings will be narrowed or even be closed by sintering at high temperature. The lack of scattering sites of vertical pores will increase thermal conductivity of the coating. However, it is noticeable that the thermal conductivity of the layered ceramic coating as aged is still quite low at 1.10 W/mK for the alternate distinct layers after sintering, which is about 53 to 62% of the thermal conductivity of 7YSZ coating as aged and 1.20 W/mK for the alternate gradient layers after sintering, which is about 58 to 66% of the thermal conductivity of 7YSZ coating as aged.

The lower thermal conductivity of the layered ceramic coating is primarily attributed to the different chemistry and structure of the coating system. Thermal conduction in ceramic materials is generated by phonon motion or photon, where phonon is a kind of lattice vibration and photon is a kind of radiation. Accordingly, to lower thermal conductivity of the thermal barrier ceramic coating imperfections are introduced into the ceramic where the mean free path length of a phonon would be shortened or the phonon vibration is impeded, and to combinations thereof. One main imperfection is point defects of oxygen vacancies. In YSZ material, as yttria is added to stabilize $ZrO_2$, oxygen vacancies are formed to maintain charge neutrality. These oxygen vacancies are strong phonon scatters. Therefore, increasing the point defects of oxygen vacancies is one approach to reduce thermal conductivity. For a baseline 7 wt % YSZ the oxygen vacancy concentration is 3.8%. For 20 wt % YSZ, the oxygen vacancy concentration is 12%. These high oxygen vacancies in 20YSZ provide larger phonon scattering to lower thermal conductivity. In addition, 7YSZ and 20YSZ have different crystal structures and different lattice parameters, with 7YSZ having a tetragonal structure and 20YSZ having a cubic structure. The differences in crystal structure and lattice parameters of the 7YSZ and 20YSZ layers will produce defects at the interface between the layers, which will increase phonon scattering to lower thermal conductivity.

Due to the contribution of the layer interfaces to lower thermal conductivity, the more layers there are, the more reduction in thermal conductivity there will be. However, due to the primary contribution of the chemistry of 20YSZ in reducing thermal conductivity, a preferred thickness of each layer is about 5 to 25 μm with about 10 to 50 alternating layers in total, which is feasible for production purposes.

The layered structure, particularly the distinct layers, is also beneficial for the increased corrosion and oxidation resistance imparted. The layered structure inhibits the corrosion or oxidation agents from traveling through the ceramic structure to the metallic substrate.

What is claimed is:

1. A metallic article comprising a metallic substrate and a thermal barrier ceramic coating on its surface, the ceramic coating comprising at least three first layers consisting essentially of about 6 to 8 wt. % yttria stabilized zirconia each alternating with at least two second layers of about 18 to 22 wt. % yttria stabilized zirconia.

2. Metallic article of claim 1 wherein the interface between the first layers and the second layers is distinct.

3. Metallic article of claim 1 wherein the interface between the first layers and the second layers is a gradient interface.

4. Metallic article of claim 1 comprising 3 to 50 first layers and 2 to 50 second layers.

5. Metallic article of claim 4 wherein each of the first layers and second layers has a thickness of about 1 μm to 50 μm.

6. Metallic article of claim 5 wherein the ceramic coating has a thickness of about 10 μm to 500 μm.

7. Metallic article of claim 1 comprising about 5 to 25 first layers and about 5 to 25 second layers.

8. Metallic article of claim 7 wherein each of the first layers and second layers has a thickness of about 5 μm to 25 μm.

9. Metallic article of claim 8 wherein one of the first layers is on the bottom of the ceramic coating adjacent to the metallic substrate and another of the first layers is on the top surface of the ceramic coating.

10. Metallic article of claim 9 further comprising a metallic bond coat.

11. Metallic article of claim 10 wherein the metallic bond coat is an MCrAlY, wherein M is selected from Ni, Co and mixtures thereof.

12. Metallic article of claim 10 wherein the metallic bond coat is an intermetallic aluminide.

13. Metallic article of claim 10 wherein the metallic article is a turbine component which has a metallic substrate of a nickel or cobalt based superalloy.

14. Metallic article of claim 1 wherein the ceramic coating is applied by EBPVD.

15. Metallic article of claim 14 wherein the EBPVD application of the ceramic coating is under a controlled electron beam power adjustment gun program.

16. Metallic article of claim 1 wherein the ceramic coating has a thermal conductivity of from about 0.6 to 1.2 W/mK from 600° C. to 1100° C.

17. Metallic article of claim 1 wherein the metallic article is a turbine component.

* * * * *